United States Patent [19]

Kobayashi et al.

[11] Patent Number: 5,241,510
[45] Date of Patent: Aug. 31, 1993

[54] SEMICONDUCTOR INTEGRATED CIRCUIT

[75] Inventors: Tsuguo Kobayashi; Kazutaka Nogami, both of Tokyo, Japan

[73] Assignee: Kabushiki Kaisha Toshiba, Kawasaki, Japan

[21] Appl. No.: 814,702

[22] Filed: Dec. 30, 1991

[30] Foreign Application Priority Data

Jan. 11, 1991 [JP] Japan .................................. 3-1988

[51] Int. Cl.$^5$ ............................................... G11C 7/00
[52] U.S. Cl. ........................... 365/230.03; 365/230.05;
365/230.08; 365/233; 365/230.06; 365/189.03;
365/49
[58] Field of Search ..................... 365/230.03, 230.05,
365/230.02, 230.06, 189.05, 189.03, 189.02, 233,
230.08, 49; 364/200

[56] References Cited

U.S. PATENT DOCUMENTS

| 4,525,777 | 6/1985 | Webster et al. | 364/200 |
| 4,833,649 | 5/1989 | Greub | 365/230.05 |
| 4,926,385 | 5/1990 | Fujishima et al. | 365/230.03 |
| 4,933,910 | 6/1990 | Olson et al. | 365/230.02 |
| 4,947,373 | 8/1990 | Yamaguchi et al. | 365/230.03 |
| 5,179,687 | 1/1993 | Hidaka et al. | 365/49 |

OTHER PUBLICATIONS

IBM Technical Disclosure Bulletin, vol. 30, No. 8, Jan. 1988.
Chuang et al., "An On-Chip 72K Pseudo Two-Port Cache Memory Subsystem," Symposium on VLSI Circuits, pp. 113-114, Jun. 1990.

Primary Examiner—Eugene R. LaRoche
Assistant Examiner—Vu Le
Attorney, Agent, or Firm—Finnegan, Henderson, Farabow, Garrett & Dunner

[57] ABSTRACT

A semiconductor integrated circuit comprises a plurality of memory blocks each provided with a set of word lines shared by the other memory blocks so that the memory blocks may be accessed separately by using different address signals entered on a time division basis. The integrated circuit also comprises one or more than one decoders for choosing a word line from an end to allow access to any of the plurality of memory blocks and a word line latch circuit inserted into the set of word lines between a pair of memory blocks. With such an arrangement, the number of decoders, word lines, bit lines, memory cells and sense amplifiers as well as the overall size of the integrated circuit can be minimized. Besides, the access time to a certain memory block that constitutes a critical factor to determine the performance the entire integrated circuit can be curtailed so that it may be accessed in a very short period of time and consequently the performance of the circuit may be remarkably improved.

24 Claims, 11 Drawing Sheets

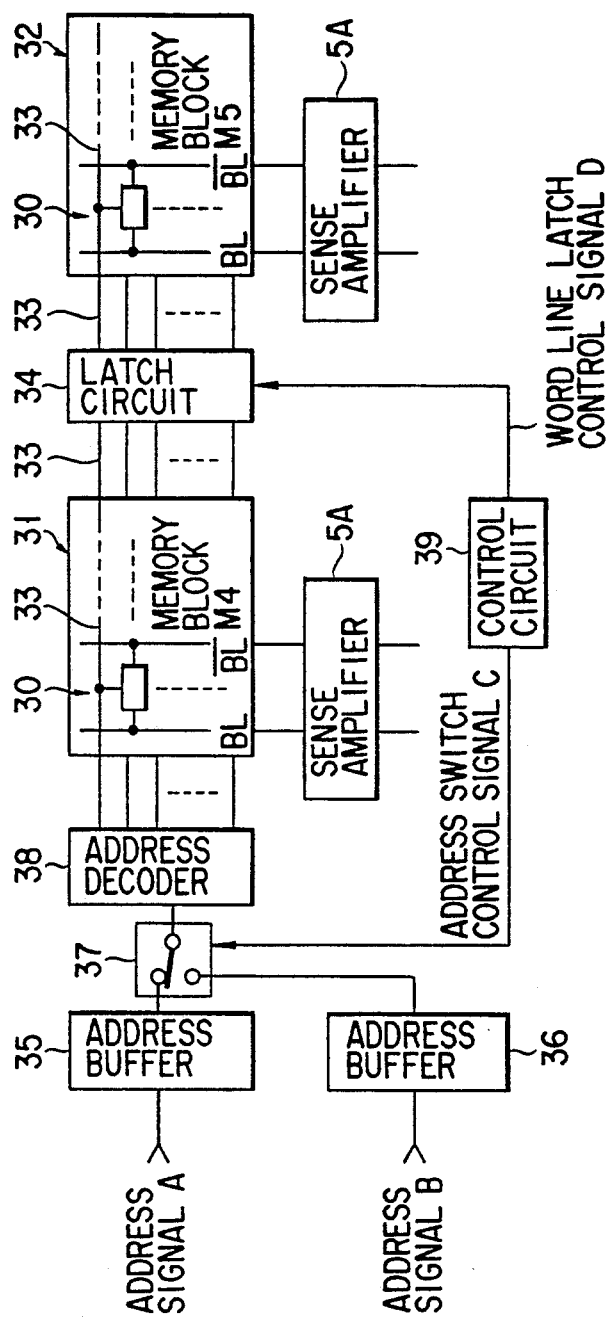
F I G. 4

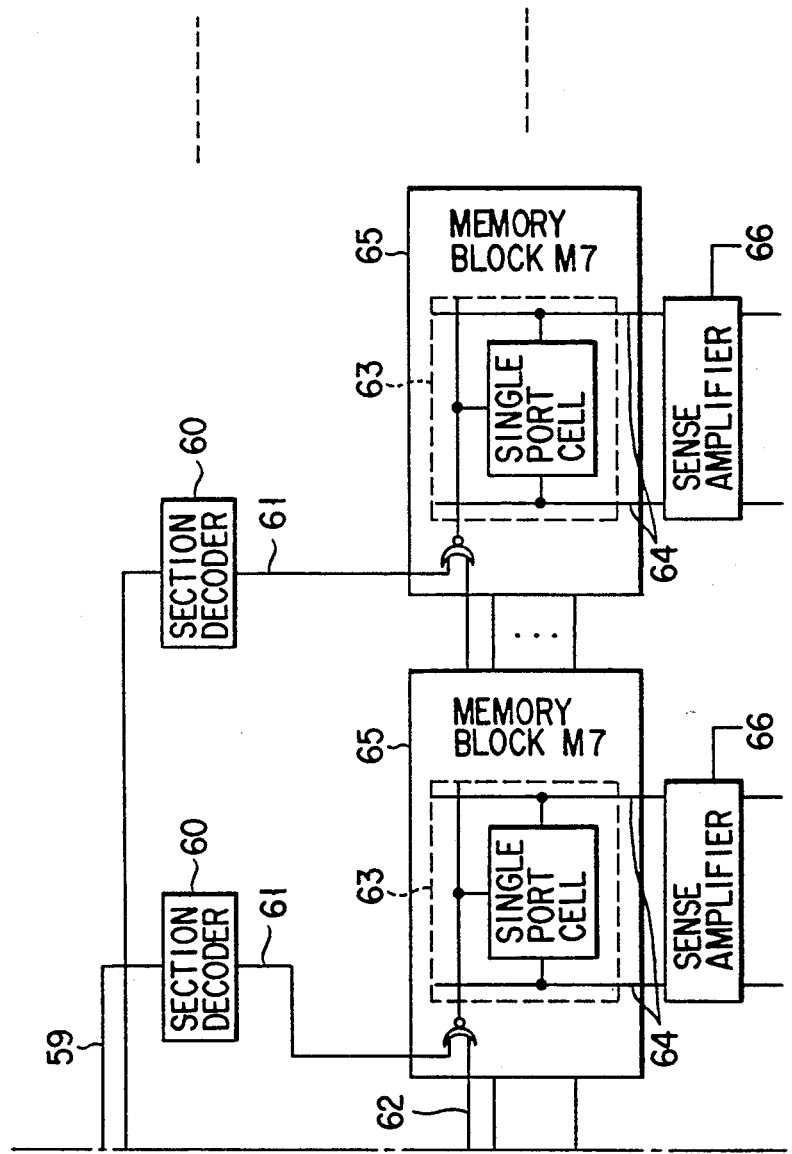
F I G. 6B 5,241,510

SEMICONDUCTOR INTEGRATED CIRCUIT

BACKGROUND OF THE INVENTION

1. Field of the Invention

The present invention relates to a semiconductor integrated circuit having a plurality of memory blocks and, more particularly, it relates to a semiconductor integrated circuit requiring a distinct memory access to each of a plurality of memory blocks.

2. Description of the Related Art

FIG. 1 illustrates a block diagram of the data storage section of a conventional integrated circuit having a memory cell array comprising a plurality of memory blocks. In FIG. 1, a first memory block 10 comprises an array of dual port memory cells 7 that can be independently accessed through either of its two ports, whereas a second memory block 15 comprises an array of single port memory cells 13. A set of word lines 5 of the dual line system of said first memory block 10 are drawn side by side into the second memory block 15. A pair of address buffer circuits 1 and 2 are disposed to receive respective address signals A and B entered through a plurality of (two in this example) external interfaces. Address decoders 3 and 4 are arranged for the respective address buffer circuits 1 and 2. A pair of sense amplifiers 11 and 12 are arranged for the respective dual ports of said first memory block 10. Another sense amplifier 16 is arranged for the second memory block 15. Reference numeral 6 in FIG. 1 denotes the other set of word lines of said first memory block 10 and numerals 8 and 9 respectively denote two different sets of bit lines of said first memory block 10, while reference numeral 14 denotes a set of bit lines of said second memory block 15.

An integrated circuit having a configuration as described above is used when different memory blocks are accessed through a plurality of external interfaces and the delayed timing with which each of the interfaces accesses an appropriate one of the memory blocks of the integrated circuit is defined by a time division cycle signal.

FIG. 2 illustrate an example of a timing chart for operating a memory circuit as shown in FIG. 1. Each of a pair of external interfaces accesses the memory block M1 (i.e., the first memory block 10) by means of an address signal A or B once for each cycle so that the memory block M1 is accessed twice in a cycle. The other memory block M2 (i.e., the second memory block 15), on the other hand, is accessed only by an external interface by means of an address signal A for the full period of each cycle.

It should be noted here that a conventional integrated circuit having a configuration as described above has to have address buffer circuits 1 and 2, decoders 3 and 4, two sets of word lines 5 and 6 as well as two sets of bit lines 8 and 9 and sense amplifiers 11 and 12 for the first memory block in order to accommodate input signals transmitted from a pair of external interfaces, making the overall circuit rather cumbersome if compared with an integrated circuit prepared for a single external interface.

FIG. 3 shows a block diagram of a semiconductor integrated circuit obtained by modifying that of FIG. 1 in an attempt to simplify the circuit configuration, where a memory block comprising an array of single port cells 24 is used for the first memory block 26. Note that the circuit components of FIG. 3 that are identical with those of FIG. 1 are indicated respectively by the same reference numerals. While the first memory block 26 needs to have only a single set of bit lines 8 and a single sense amplifier 11 to handle input signals from a pair of external interfaces, it still requires a decoder 3 for the first memory block 26 to be accessed by two external interfaces, a decoder 21 for the second memory block 15 to be accessed by a single external interface by means of an address signal A, two sets of word lines 22, 23 for output signals from the decoders and a switch 19 for switching address signals to be sent to the decoder 3 of the first memory block 26. In short, at least two decoders 3 and 21 as well as two sets of word lines 22 and 23 need to be there to establish two signal transmission systems.

Thus, up until now, the use of multiple port memories and more than one decoders and word line sets has been indispensable to set up more a plurality of data transmission systems within a conventional semiconductor integrated circuit if any of its memory blocks are to be accessed by more than one external interfaces. Consequently, the overall size of such an integrated circuit and the number of transistors contained in it have been inevitably very large to push up the manufacturing cost, while the data storage capacity that a single chip can provide has been limited. On the other hand, the use of more than one decoders and word line sets in a single integrated circuit can constitute a redundancy of components particularly when it is accessed by a single external interface for many consecutive cycles as only one of the decoders and the corresponding set of word lines are busy then while the other decoder and the other set of word lines remain idle.

SUMMARY OF THE INVENTION

In view of the above problems, it is therefore the object of the present invention to provide a semiconductor integrated circuit that comprises minimum number of components including decoders, word line sets, bit line sets, memory cells and sense amplifiers to handle accesses to its different memory blocks by a plurality of external interfaces and allows fast access to a certain memory block that plays a critical role for the overall performance of the semiconductor integrated circuit.

According to an aspect of the present invention, there is provided a semiconductor integrated circuit a semiconductor integrated circuit comprising a plurality of memory blocks each provided with a set of word lines that are shared by the other memory blocks, one or more than one address decoders connected to an end of said set of word lines for the plurality of memory blocks for decoding address signals entered on a time division basis and a word line latch circuit for latching word line signals entered to the word lines between a given pair of memory blocks selected from said plurality of memory blocks.

According to another aspect of the present invention, there is provided a semiconductor integrated circuit comprising a semiconductor integrated circuit comprising a plurality of memory blocks each provided with a set of word lines shared by the other memory blocks one or more than one address decoders connected to an end of the set of word lines for decoding address signals, an address switch circuit for choosing an address signal out of a plurality of entered address signals and giving it to an appropriate one of the address decoders, a latch circuit inserted into the set of word lines connecting the plurality of memory blocks for latching address signals by way of the set of word lines, a logic circuit for logically processing a value read out of the memory block upstream to the latch circuit and controlling the operation of reading/writing data from and into the memory block downstream to the latch circuit, and a control circuit for generating a first control signal for the address switch circuit, a second control signal for the latch circuit with a given first delayed timing in synchronism with the first control circuit and a third control signal for the logic circuit with a given second delayed timing in synchronism with the first control circuit on a time division basis in order to control the memory blocks such that they may be accessed by different respective address signals.

According to still another aspect of the present invention, there is provided a semiconductor integrated circuit comprising first and second memory blocks each provided with a set of word lines shared by the memory blocks, the first memory block being a memory block for storing tag address and valid data for a cache memory, the second memory block being a memory block for storing cache data for the cache memory, one or more than one address decoders connected to an end of said set of word lines for decoding address signals, an address switch circuit for choosing an address signal out of a plurality of entered address signals and giving it to an appropriate one of the address decoders, a latch circuit inserted into the set of word lines connecting the plurality of memory blocks for latching address signals by way of the set of word lines, a comparator/hit generating circuit for generating a hit signal on the basis of a value read out of the first memory block, and a control circuit for generating a control signal for controlling the latch circuit and a control signal for controlling the comparator/hit generating circuit on a time division basis to control them such that the first memory block is accessed by means of a pair of address signals in a memory access cycle on a time division basis while the second memory block is accessed by using either of a pair of address signals.

Addresses of the memory blocks can be selected and specified by address signals given to the integrated circuit on a time division basis. Since a latch circuit is inserted in a set of word lines connecting a given pair of memory block to divide said set of word lines into two portions, the portion of the set of word lines to be used for the memory block located downstream to the latch circuit can operate independently as if they were a separate set of word lines. Consequently, the memory block located upstream to the latch circuit can be accessed by a plurality of external interfaces, while the memory block located downstream to the latch circuit is accessed by a single external interface.

Thus, with an arrangement of an integrated circuit according to the invention as described above, it is possible that one of its memory blocks comprising an array of single port memory cells and designed for access through a single port is used as often as possible so that it can be accessed by a plurality of external interfaces, while another memory block comprising an array of dual port memory cells is accessed by a plurality of interfaces through the dual access routes. Besides, since a set of decoder, word lines, bit lines and a sense amplifier can accommodate more than one access operations by a plurality of interfaces, the overall circuit configuration of such an integrated circuit can be simplified to minimize the size of the circuit. Moreover, when the time required to access any of the memory blocks constitutes a critical factor to determine the overall performance of an integrated circuit, the access time can be minimized by reducing the parasitic capacity of the word lines to allow fast access to the memory blocks particularly when the capacity of the memory block that is subject to frequent access is small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram of a first embodiment of the semiconductor integrated circuit of the present invention;

FIGS. 6A and 6B are block diagrams of a second embodiment of the semiconductor integrated circuit of the present invention when taken together;

DETAILED DESCRIPTION OF THE PREFERRED EMBODIMENTS

Figure 1:
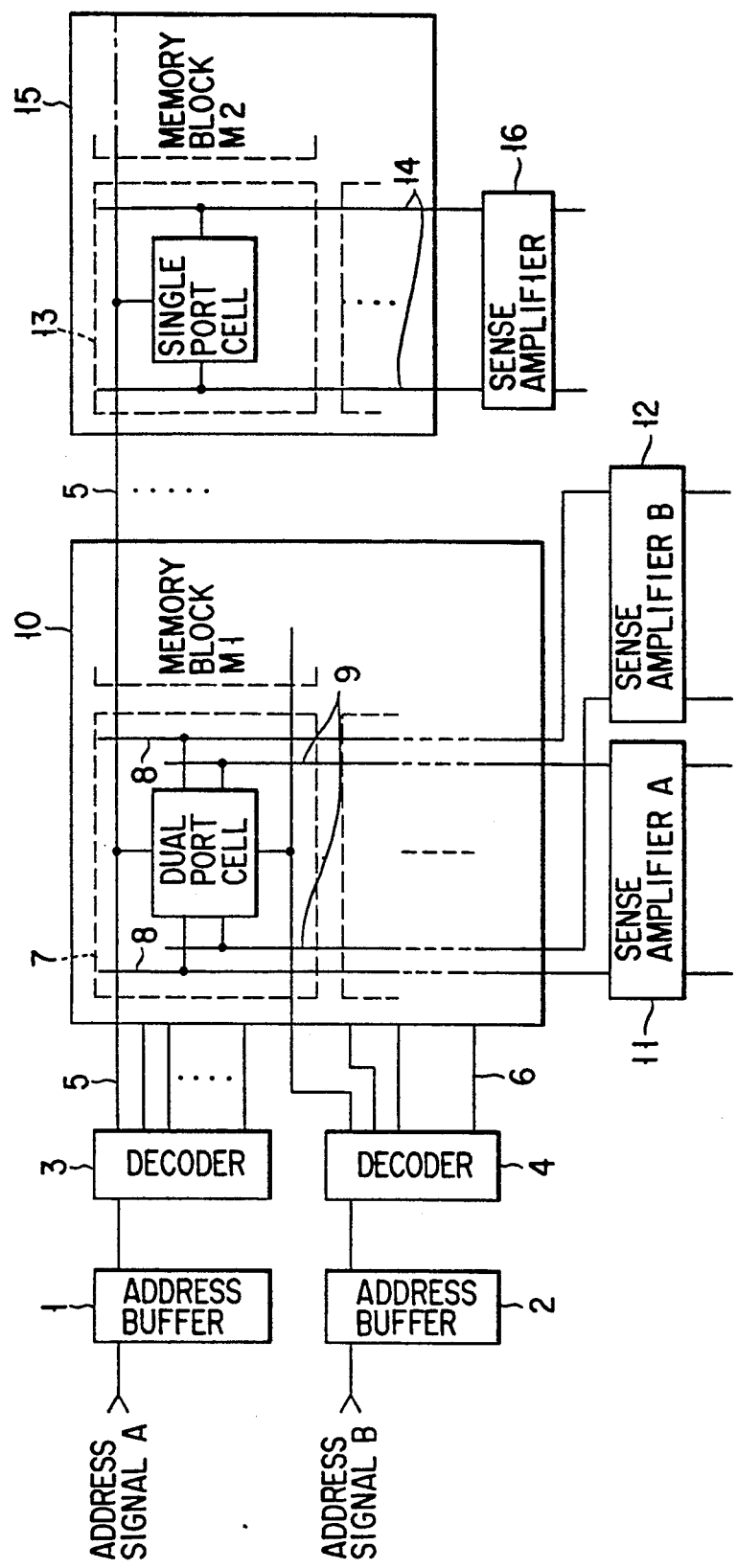
FIG. 1 is a block diagram of a conventional semiconductor integrated circuit comprising a memory block constituted by an array of dual port cells and a memory block having an array of single port cells.
Figures 2, 3:
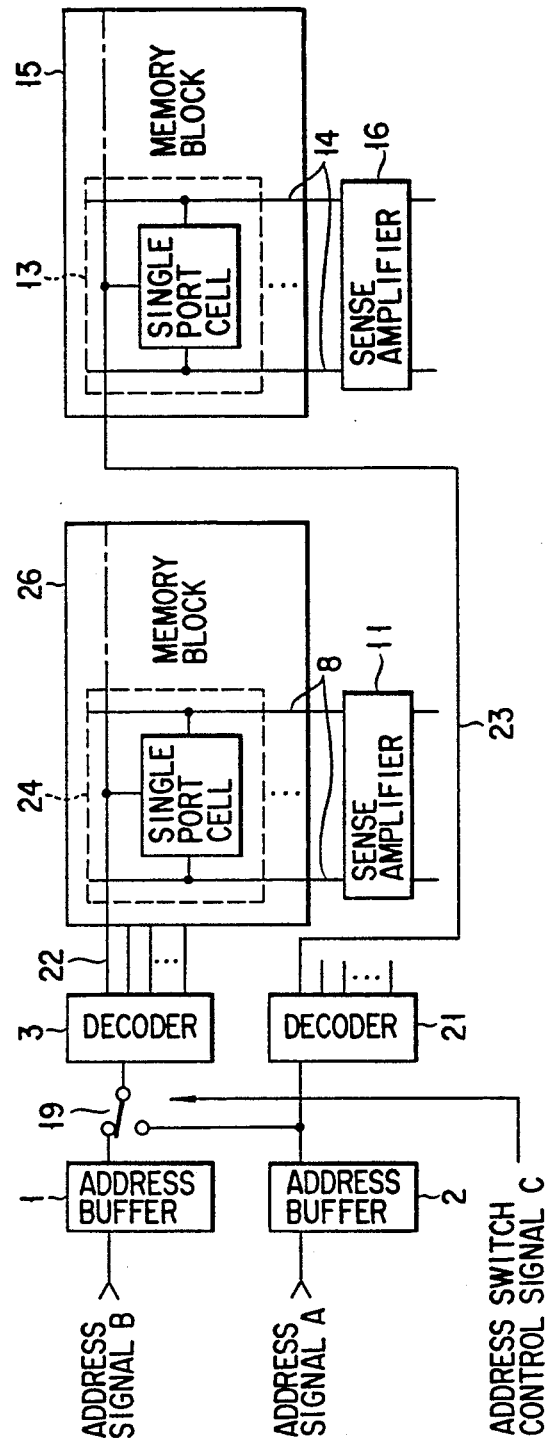
FIG. 2 is a chart illustrating the timing of operation of the semiconductor integrated circuit o FIGS. 1 and 3.
FIG. 3 is a block diagram of another conventional semiconductor integrated circuit comprising memory blocks, each being constituted by an array of single port cells.

Firstly a first embodiment of the semiconductor integrated circuit of the present invention will be described by referring to FIG. 1 showing a block diagram of the embodiment. This first embodiment comprises a microprocessor unit MPU, a peripheral controller and other logic circuits (not shown) as well as a pair of memory blocks arranged on a single chip so that the memory blocks can be separately accessed by a pair of external interfaces. The delayed timing with which each of the interfaces accesses an appropriate one of the memory blocks of the integrated circuit is defined by a time division cycle signal Each of the two memory blocks 31

(M4) and 32 (M5) comprises an array of single port memory cells 30 and therefore can be accessed by way of a single port, while they are provided with a single set of word lines 33 that can be shared by them. A word line latch circuit 34 for latching word line signals is inserted into the set of word lines 34 between the two memory blocks to divide them into two separate portions. A pair of address buffer circuits 35 and 36 are arranged to handle respective address signals A and B from external interfaces. An address switch circuit 37 is disposed to selectively take in an address signal from one of the two address buffer circuits 35 and 36. An address decoder (a raw decoder in this embodiment) 38 is arranged at an end of the word lines 33 upstream to said word line latch circuit 34 to decode the address signals transmitted on a time division basis from the address switch circuit 37 and choose a word line out of the set of word lines for each of said two memory blocks 31 and 32. A control circuit 39 is provided to generate an address switch control signal C and a word line latch control signal D on the basis of a clock signal and a signal defining the memory access cycle which it receives so that said memory blocks 31 and 32 are accessed by different external interfaces on a time division basis. Reference symbols BL and $\overline{BL}$ denote bit lines for the memory blocks, and 5A denotes a sense amplifier for amplifying the signals read out from the corresponding one of the memory blocks.

Now, the operation of the first embodiment of the invention will be described by referring to FIGS. and 5.

A word line latch control signal D is generated in synchronism with an address switch control signal C by the control circuit 39 with a delayed timing that accommodates the time required for a sequence of operation of said address decoder 38. In the former half $\phi 1$ of a cycle, the switch circuit 37 is so controlled by an address switch control signal C that the output of the address buffer circuit 35 that receives an address signal A is connected to the decoder 38 (FIG. 5A) and the latch circuit 34 is brought into a "through" condition by a control signal D (FIG. 5B). Then, the word lines 33 are driven by the output signal obtained by decoding the address signal A so that the memory block 31 (M4) and 32 (M5) are accessed from outside by means of the address signal A (FIGS. 5C and 5D). In the latter half $\phi 2$ of the cycle, on the other hand, the switch circuit 37 is so controlled by an address switch control signal C that the output of the address buffer circuit 36 that receives an address signal B is connected to the decoder 38 (FIG. 5A) and the memory block 31 (M4) is accessed from outside through the word lines 33 by means of the address signal B (FIG. 5C). At the same time, the latch circuit 34 is caused to latch a control signal D (FIG. 5B) so that the word lines 33 for the memory block 32 (M5) maintain the condition where the address signal A is decoded in the former half $\phi 1$ of the cycle and the memory block 32 (M5) keeps on being accessed by means of the address signal A under this condition (FIG. 5D). In other words, the portion of the set of word lines 33 for the memory block M5 found downstream to the latch circuit 34 can be operated as if they were a separate set of word lines by appropriately controlling the latch circuit 34.

Thus, the two memory blocks of the above described embodiment, each of which is constituted by an array of single port memory cells, can be accessed by two external interfaces. More specifically, the two memory blocks can be accessed by two external interfaces by way of a single memory access system comprising a decoder 38, a set of word lines 33, a set of bit lines BL and $\overline{BL}$ and a sense amplifier 5A so that the overall circuit configuration of the semiconductor integrated circuit can be significantly simplified. Besides, since a set of word lines connecting the two memory blocks are divided into two portions by a latch circuit 34, the parasitic capacity of the word lines 33 is reduced to shorten the time required for an access operation. This will be particularly significant when the path through which memory blocks are accessed constitutes a critical factor for the overall performance of a semiconductor integrated circuit. In this respect, the above described embodiment is particularly advantageous because it provides a fast access capability to the memory block 31, which has to be accessed frequently if its memory capacity is relatively small, because of the divided set of word lines 33 that can serve for both of the memory blocks as if they are two separate sets of lines and their reduced parasitic capacity.

Figure 6A:
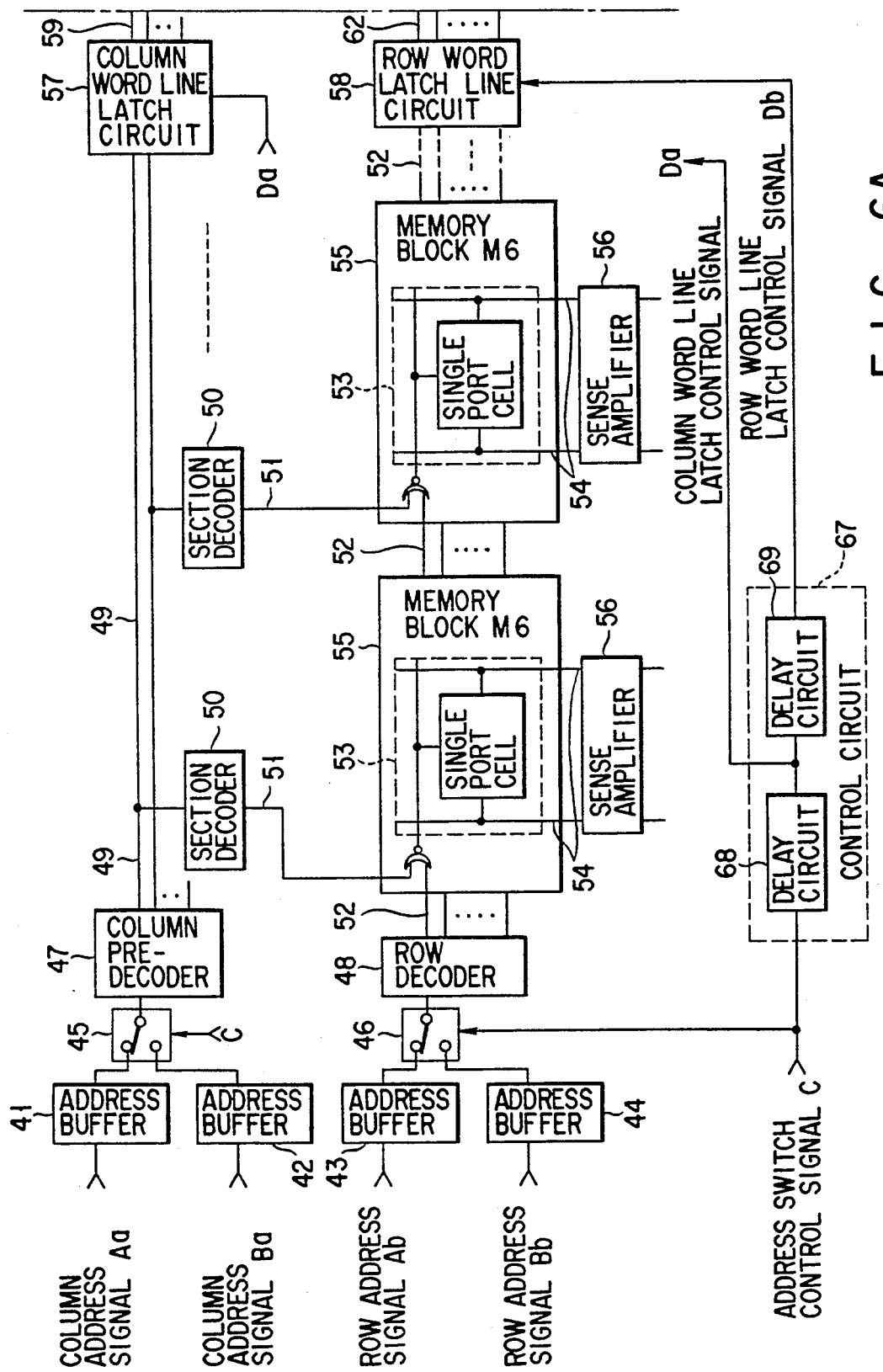

FIG. 6 is a block diagram of a second embodiment of the semiconductor integrated circuit of the present invention. This second embodiment is a semiconductor integrated circuit comprising dual word line system type memory blocks 55 (M6) and 65 (M7). The components of this embodiment that are similar to those of the first embodiment are indicated by identical reference symbols as shown in FIG. 4. The memory block 55 has an array of single port cells 53 and is so designed that word line selection can be conducted between a set of main word lines 52 and a set of section word lines 51 of the double word line configuration. The memory block 65 comprises an array of single port cells 63 and is so designed that word line selection can be conducted between a set of main word lines 62 and a set of section word lines 61. Reference numeral 54 denotes a set of bit lines for the memory block 55 and numeral 64 denotes a set of bit lines for the memory block 65. Reference numerals 56 and 66 respectively denote a sense amplifier for the memory block 55 and a sense amplifier for the memory block 65. A pair of address signals A and B are respectively divided into column address signals Aa and Ba and row address signals Ab and Bb. A pair of column address buffer circuits 41 and 42, a column address switch circuit 45 and a column predecoder 47 are arranged for a column address system of the embodiment. A column decoder is constituted by the column predecoder 47 and a pair of section decoders 50 and 60 corresponding respectively to the memory blocks 55 and 65 in order to reduce the line capacity of the sets of section word lines 51 and 61. On the other hand, a pair of row address buffer circuits 43 and 44, a row address switch circuit 46 and a row decoder 48 are arranged for a row address system of the embodiment.

A column word line latch circuit 57 and a row word line latch circuit 58 constitute the latch circuit for the word lines of the embodiment. The row word line latch circuit 58 is inserted between a set of main word lines 52 for the memory block 55 connected to the row decoder 48 and another set of word lines 62 for the memory block 65. The column word line latch circuit 57 is inserted between a set of column word lines 49 connected to the column predecoder 47 and another set of column word lines 59 for the memory block 65. A control circuit 67 generates an address switch control signal C, a column word line latch control signal Da and a row word line latch control signal Db to control the memory blocks 55 and 65 in such a manner that they may be accessed by different external interfaces (not shown) on a time division basis. The control circuit 67 delays the address switch control signal C by means of a delay circuit 68 and generates the column word line latch control signal Da with a timing delayed by a period of time required for a sequence of operation of the column predecoder 57 which is synchronized with said control signal C. Besides, the control circuit 67 delays the control signal Da by means of another delay circuit 69 and generates the row word line latch control signal Db with a timing delayed by a period of time required for a sequence of operation of the row address decoder 48.

Figure 5:
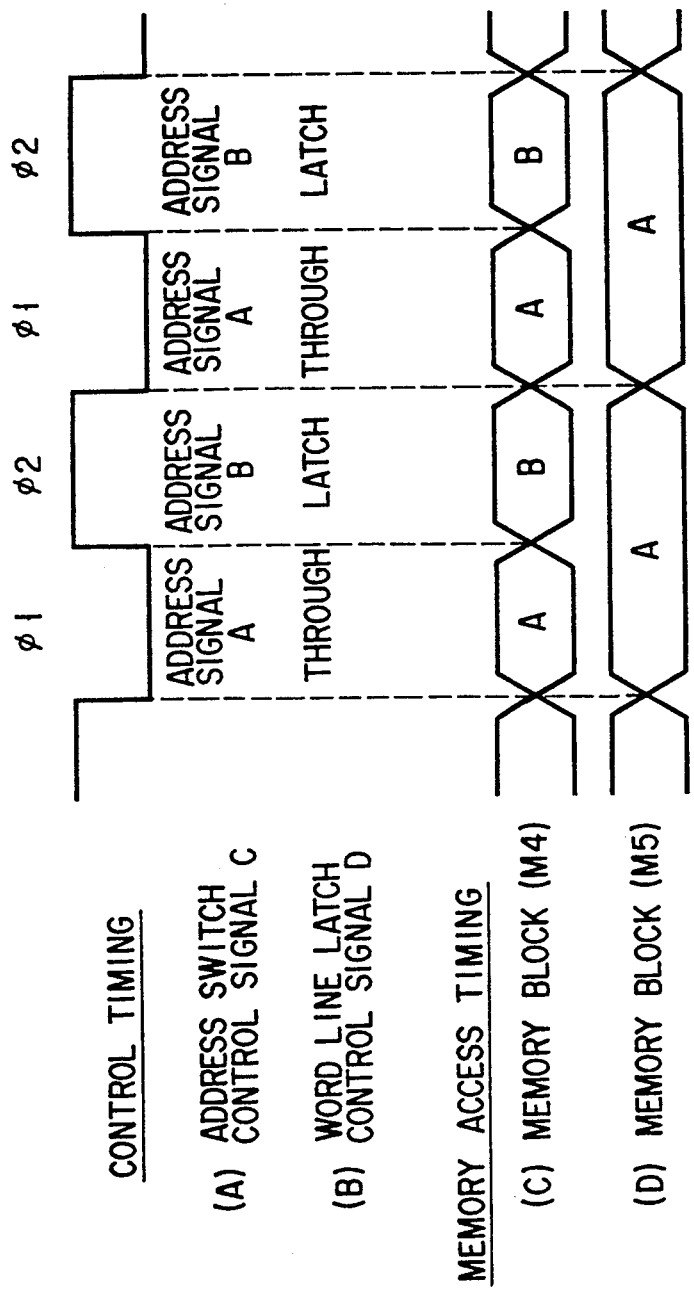
FIG. 5 is a chart illustrating the timing for control and memory access of the first embodiment of FIG. 4.

The memory circuit of the FIG. 6 is controlled in the following manner so that it may operate with the timing as illustrated in FIG. 5 for the memory circuit of FIG. 4. In the former half $\phi1$ of a cycle, the memory blocks 55 and 65 are accessed by means of an address signal A, whereas, in the latter half $\phi2$ of the cycle, the memory block 55 is accessed by means of another address signal B while the memory block 65 is accessed by the address signal A. If, in this case, the address switch circuits 45 and 46, the column word line latch circuit 57, the row word line latch circuit 58 are operated with a same timing, the signals can be delayed by a period of time required for decoding at the downstream of the circuit to produce a time lag so that wrong signals may be inadequately latched. Such a situation can be avoided and desired operation of the memory circuit can be realized by differently delaying the three different control signals C, Da and Db while maintaining their synchronism.

Thus, the above described second embodiment comprising a pair of memory blocks 55 and 65, each having only an array of single port cells, allows two different external interfaces to access the memory blocks by means of a single word line system constituted by a set of word lines, a set of bit lines and a single sense amplifier so that the overall circuit configuration can be minimized, while the advantages of a dual word line system such as reduction of the parasitic capacity of the sets of main word lines 52, 62 and reduction of the number of word lines and that of memory cells to be activated for an access operation are present there. It may be understood that the above embodiment is particularly advantageous if it involves a large memory capacity.

Figure 7:
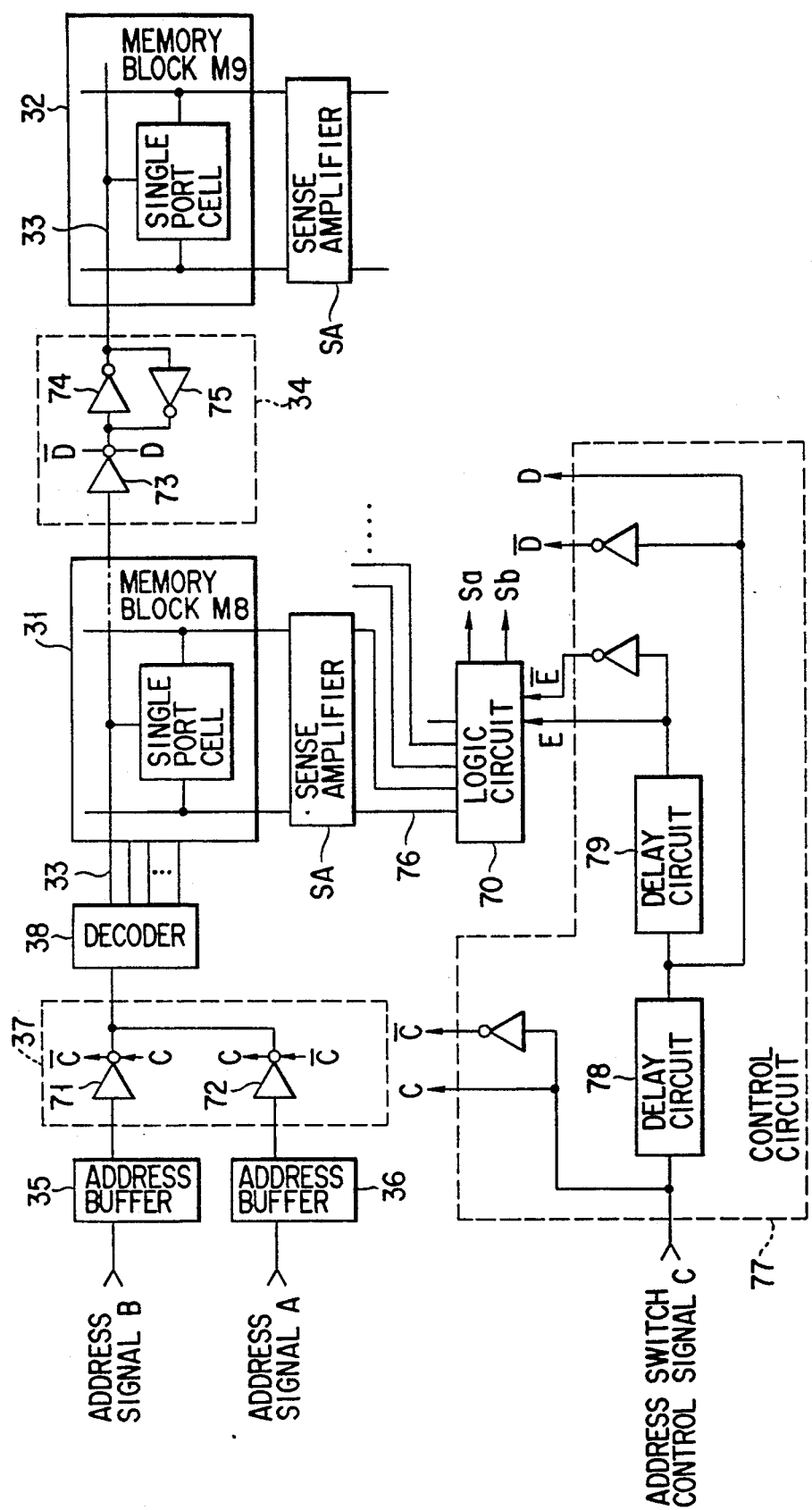
FIG. 7 is a block diagram of a third embodiment of the semiconductor integrated circuit of the present invention.

FIG. 7 is a block diagram of a third embodiment of the semiconductor integrated circuit of the invention. This third embodiment differs from the first embodiment in that it comprises a logic circuit 70 for logical processing of data read out of an upstream memory block arranged near a row decoder. The components of this embodiment that are similar to those of the first embodiment are indicated by identical reference symbols as shown in FIG. 4. The switch circuit 37 of the embodiment comprises a pair of clocked inverters 71, 72 to be controlled by complementary control signals C and $\overline{C}$. The word line latch circuit 34 of this embodiment comprises a clocked inverter 73 to be controlled by complementary control signals D and $\overline{D}$ and a pair of inverters 74 and 75 which are arranged behind the clocked inverter 73 and whose input/output terminals are connected crosswise. The logic circuit 70 is designed to control read/write operation of the downstream memory block 32 according to the result of logically processing the data read out of the upstream memory block 31 and at the same time to latch the logical output Sa for the data read out in response to an address signal A at a time when the memory block 31 is accessed by a desired external interface in view of the fact that the active output 76 of the sense amplifier SA is shifted within a cycle on the basis of time division and the logical output Sa should be held effective during the entire cycle. The control circuit 77 of this embodiment generates address switch control signals C and $\overline{C}$, word line latch control signals D and $\overline{D}$ and logic circuit control signals E and $\overline{E}$ on a time division basis to control the memory blocks so that they may be accessed by different external interfaces. The control circuit 77 delays the address switch control signal C by means of a delay circuit 78, synchronize it with the control signals C and $\overline{C}$ and generates the word line latch control signals D and $\overline{D}$ with a delayed timing that approximately corresponds to the time required for a sequence of operation of the address decoder 38. It delays the control signal D by means of a delay circuit 79, synchronize it with the control signals C and $\overline{C}$ and generates the logic circuit latch control signals E and $\overline{E}$ with a delayed timing that approximately corresponds to the time required for a sequence of operation of said address decoder 38, a sequence of operation of reading data from the memory block 31 and a sequence of sensing operation of the sense amplifier Sa for the memory block 31.

Figure 8:
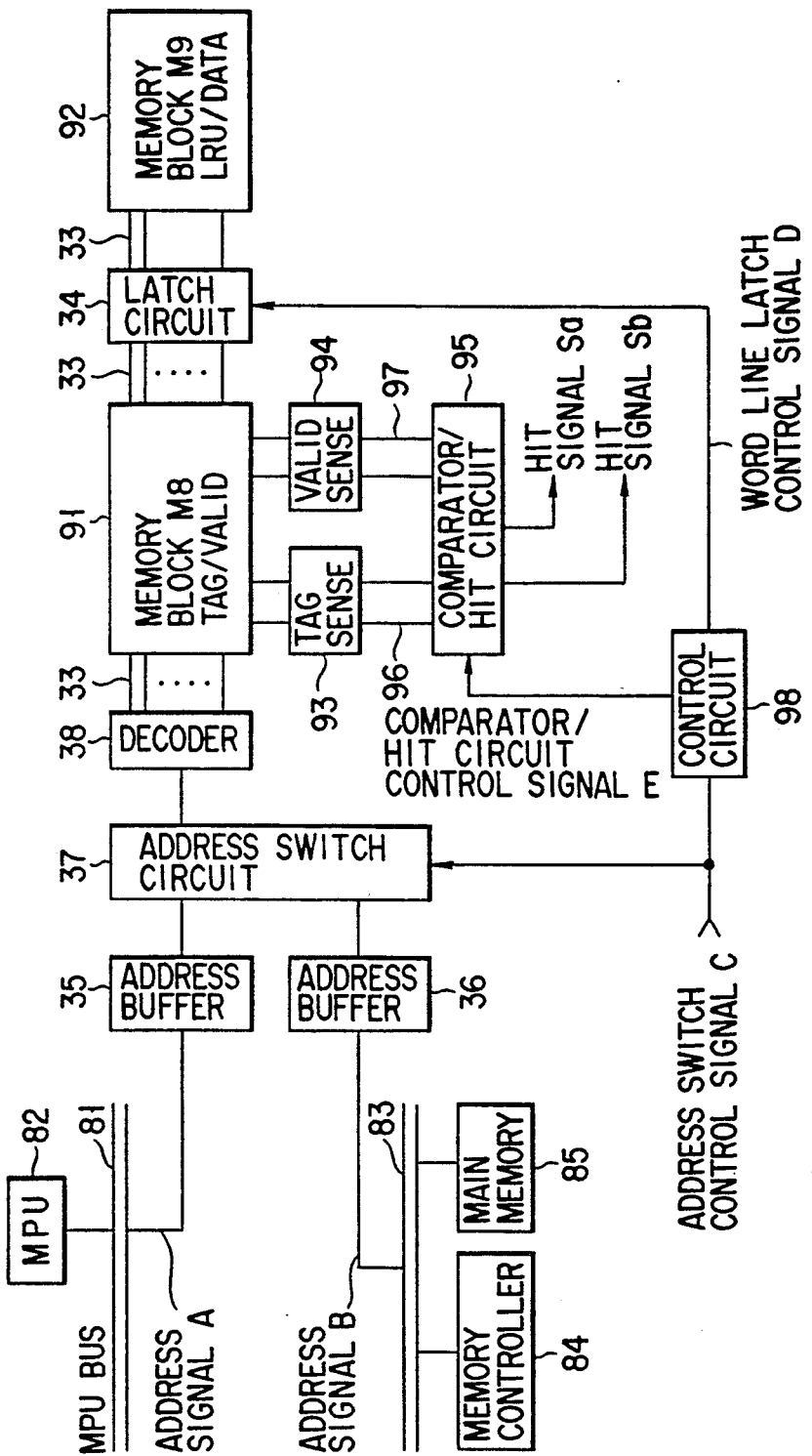
FIG. 8 is a block diagram of a fourth embodiment of the semiconductor integrated circuit of the present invention.
Figure 9:
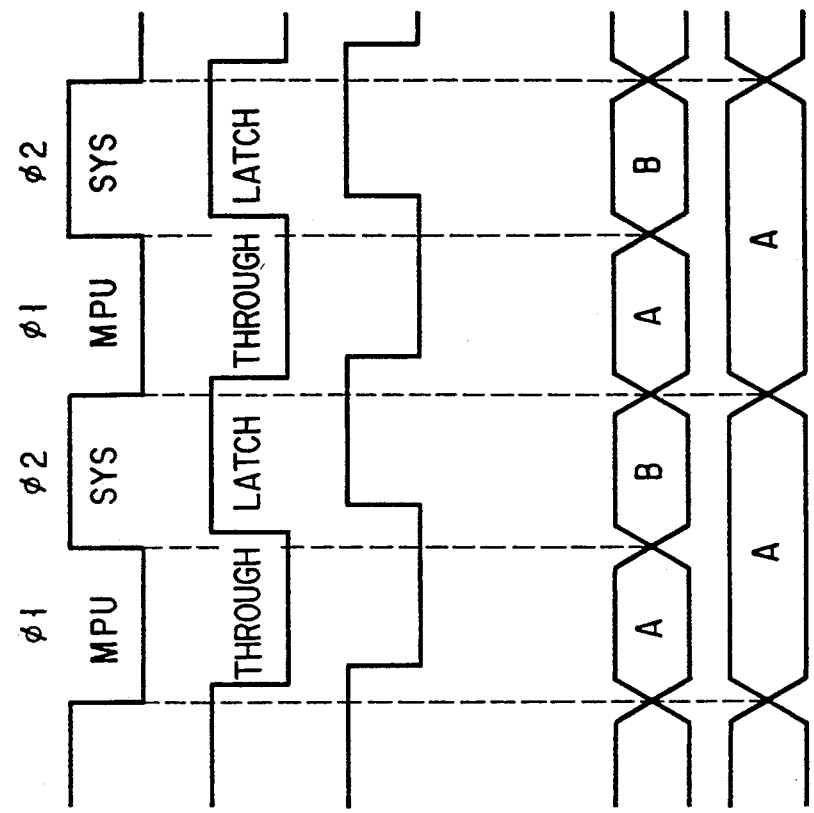
FIG. 9 is a chart illustrating time for control and memory access of the fourth embodiment of FIG. 8.

The memory circuit of the FIG. 7 is controlled in the following manner so that it may operate with the timing as illustrated in FIG. 9 for the memory circuit of FIG. 8. In the former half $\phi1$ of a cycle, the memory blocks 32 and 32 are accessed by means of an address signal A, whereas, in the latter half $\phi2$ of the cycle, the memory block 31 is accessed by means of another address signal B while the memory block 32 is accessed by the address signal A. If, in this case, the address switch circuit, the latch circuit, and the logic circuit are operated with a same timing, the signals can be delayed by a period of time required for decoding at the downstream of the circuit to produce a time lag so that wrong signals may be inadequately latched. Such a situation can be avoided and desired operation of the memory circuit can be realized by synchronizing three different sets of controls signals C, $\overline{C}$; D, $\overline{C}$; and E, $\overline{E}$ and supplying them with a timing that differently delays them to control the address switch circuit, the word line latch circuit and the logic circuit in a concerted manner from the stage of address input down to that of logical output.

Thus, the above described third embodiment can be operated in a concerted manner from the stage of address input down to the output Sa and Sb of the logic circuit 70 without increasing the overall size and the complexity of the semiconductor integrated circuit. While the overall performance of the semiconductor integrated circuit may be judged by the time required to access the memory block 31 that needs to be accessed twice in a cycle, the access time for the memory block 31 can be curtailed by dividing a set of word lines 33 into two parts by the word line latch circuit 34 to reduce the capacity of the portion of the word lines 33 for the memory block 31.

FIG. 8 is a block diagram of a fourth embodiment of the semiconductor integrated circuit of the present invention. This third embodiment comprises a logic circuit having a cache memory that can be accessed by two buses (MPU bus 89 and system bus 92) that operate as two external interfaces. The components of this embodiment that are similar to those of the first embodiment are indicated by identical reference symbols as shown in FIG. 4. This embodiment differs from the first embodiment in a manner as described below. An MPU 82 is connected to the MPU bus 81 and an address signal A is entered to an address buffer circuit 35 by way of the MPU bus 81. The system bus 83 is connected with a main memory 84 and a memory controller 85 so that an address signal B is entered to the address buffer circuit 36 by way of the system bus 83. A first memory block 91 stores tag addresses (TAG) and valid bit data (VALID) for the cache memory. A second memory block 92 stores LRU (least recently used) bit data and cache data (DATA) for the cache memory. Reference numerals 93 and 94 respectively denote a sense amplifier for TAG and a sense amplifier for VALID to be used for the first memory block 91. A comparator/hit generating circuit 95 is arranged to generate hit signals Sa for the MPU bus 81 from the outputs 96 and 97 of the respective sense amplifiers 93 and 94 and hit signals (snoop hit signals) Sb for the system bus 83. The control circuit 98 of this embodiment generates an address switch control signal C and a word line latch control signal D, a comparator/hit generating circuit latch control signal E for each cycle of operation on a time division basis so that the memory blocks of the embodiment may be accessed from different external interfaces. The control circuit 98 delays the address switch control signal C by a period of time required for a sequence of operation of the address decoder 38 and generates the word line latch control signal D with a delayed timing good for synchronization with the control signal C. Besides, the control circuit 98 delays the control signal D by a period of time required for a sequence of operation of the address decoder 38, a sequence of operation of reading data out of the memory block and a sequence of sensing operation of the sense amplifiers 93 and 94 and generates comparator/hit generating circuit latch control signal E with a delayed timing good for synchronization with the control signal C.

Now, a fourth embodiment of the invention and how it operates will be described by referring to FIGS. 8 and 9.

In the former half $\phi 1$ of a cycle, the address switch control circuit 37 of this embodiment is controlled by an address switch control signal C to receive an address signal A from the MPU bus 81 (FIG. 9A) and the latch circuit 34 is made through by a word line latch signal D so that the memory block 91 (M8) and 92 (M9) may be accessed by the MPU bus 81 by means of the address signal A from the MPU bus 81 (FIGS. 9D and 9E). In the latter half $\phi 2$ of the cycle, on the other hand, the address switch circuit 37 is connected to the system bus (SYS) 83 (FIG. 9A) to cause the latch circuit 34 (FIG. 9B) to operate in such a manner that the first memory block 91 may be accessed by the system bus 83 by means of an address signal B from the system bus 83 while the second memory block 92 may be accessed by the address signal A from the MPU bus 83 (FIGS. 9D and 9E). Sense circuits 93 and 94 transmit the value obtained by the access operation of the MPU bus 81 in the former half $\phi 1$ of the cycle and the value obtained by the access operation of the system bus 83 in the latter half $\phi 2$ of the cycle. The comparator/hit generating circuit 95 transmits a hit signal Sa of the MPU bus 83 obtained from the outputs 96 and 97 of the respective sense circuits 93 and 94 in the former half $\phi 1$ of the cycle, whereas it transmits a hit signal (snoop hit signal) Sb of the system bus 83 obtained also from the outputs 96 and 97 of the respective sense circuits 93 and 94 in the latter half $\phi 2$ of the cycle. It should be noted here that the second memory block 92 has to keep on being accessed by the MPU bus 81 in order to enter and retrieve cache data into and from the memory block 92 according to the hit signal Sa obtained by the access operation of the MPU bus 81 in the former half $\phi 1$ of the cycle and, therefore, the comparator/hit generating circuit 95 needs to be able to latch the hit output Sa obtained by the access operation of the MPU bus 81. This can be achieved by synchronizing the three different control signals C, D and E, which will be supplied with a slightly delayed timing so that a series of operation from entering an address to generating hit signals Sa and Sb can be conducted in a concerted manner by appropriately controlling the address switch circuit, the word line latch circuit and the comparator/hit generating circuit.

As seen from the above described fourth embodiment of the invention, the present invention provide a cache integrated circuit having a large storage capacity without undesirably increasing the overall size of the circuit.

Figure 10:
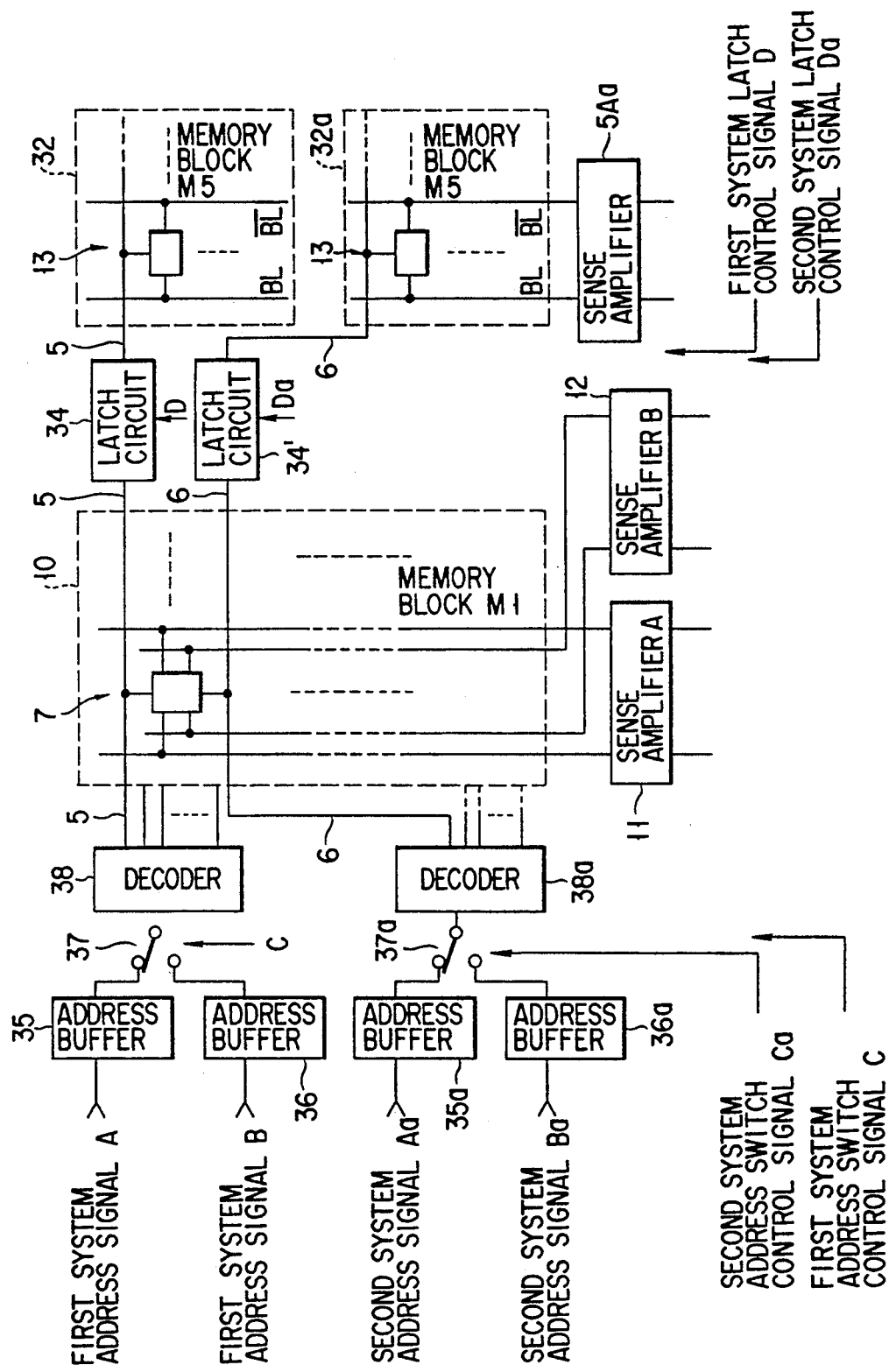
FIG. 10 is a block diagram of a fifth embodiment of the present invention.

FIG. 10 is a block diagram of a fifth embodiment of the semiconductor integrated circuit of the present invention. This fifth embodiment comprises a first memory block 19 constituted by an array of dual port memory cells 7 and a pair of second memory blocks 32 and 32a constituted by respective arrays of single port memory cells 13 and provided with respective sets of word lines 5 and 6 that correspond to the two sets of word lines of the first memory block. The components of this embodiment that are similar to those of the first embodiment are indicated by identical reference symbols as shown in FIG. 4. Reference symbols 34a through 38a respectively denote circuits that constitute another set of circuits that correspond to the above described first set of circuits 34 through 38. Aa and Ba denote address signals for the other system, while Ca and Da denote control signals for that system. This fifth embodiment resembles the first embodiment in that it has a dual circuit system and each set of circuits operate in a manner similar that of the circuits of the first embodiment.

Figure 11:
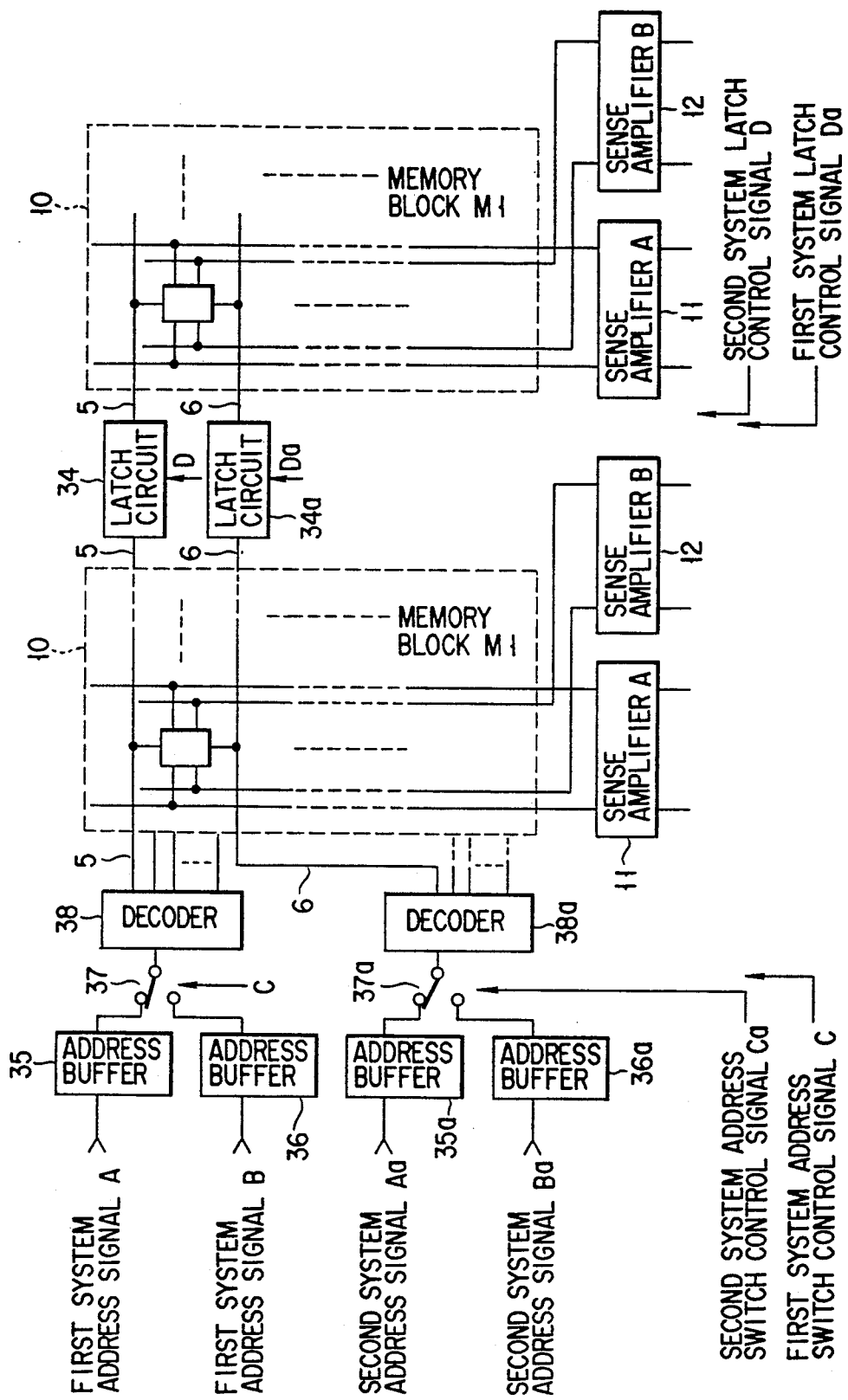
FIG. 11 is a block diagram of a sixth embodiment of the present invention.

FIG. 11 is a block diagram of a sixth embodiment of the semiconductor integrated circuit of the present invention. This sixth embodiment comprises a pair of memory blocks 10 each constituted by an array of dual port memory cells. The components of this embodiment that are similar to those of the fifth embodiment are indicated by identical reference symbols as shown in FIG. 10. This embodiment operates in a manner similar to that of the fifth embodiment and its overall size can be significantly reduced as compared with an integrated circuit comprising memory blocks constituted by arrays of 4 port memory cells.

As is apparent from the above description, a semiconductor integrated circuit according to the invention comprises only a minimum number of decoders, word lines, bit lines, memory cells, sense amplifiers and other elements so that the overall size of the integrated circuit can be minimized, simplifying its configuration to a remarkable extent. Moreover, some of the memory blocks that constitute a critical factor for the overall performance of the integrated circuit allow fast access to make it a highly efficient and effective integrated circuit.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
   a plurality of memory blocks each provided with a set of word lines shared by the other memory blocks;
   one or more than one address decoders connected to an end of said set of word lines for decoding address signals;
   an address switch circuit for choosing an address signal out of a plurality of entered address signals and giving it to an appropriate one of said address decoders;
   a latch circuit inserted into said set of word lines connecting said plurality of memory blocks for latching address signals by way of said set of word lines; and
   a control circuit for controlling said address switch circuit and said latch circuit on a time division basis by synchronizing the operation thereof, selectively switching said address switch circuit for each of the entered address signals and causing said latch circuit to latch said address signal.

2. A semiconductor integrated circuit according to claim 1, wherein said address decoders are row decoders commonly arranged for said plurality of memory blocks.

3. A semiconductor integrated circuit according to claim 1, wherein said address decoders are row decoders commonly arranged for said plurality of memory blocks and column decoders for selecting columns of said plurality of memory blocks.

4. A semiconductor integrated circuit according to claim 1, wherein it further comprises a plurality of address buffer circuits arranged accommodate address signals entered by a plurality of interfaces.

5. A semiconductor integrated circuit according to claim 1, wherein said control circuit generates on a time division basis a control signal for controlling said address switch circuit and with a delayed timing a control signal synchronized with said control signal for controlling said latch circuit in order to control said memory blocks such that they may be accessed by different respective address signals.

6. A semiconductor integrated circuit according to claim 5, wherein said delayed timing is determined by a time required for operations of said address decoders.

7. A semiconductor integrated circuit according to claim 1, wherein each of said memory blocks is constituted by a array of single port memory cells.

8. A semiconductor integrated circuit according to claim 1, wherein said plurality of memory blocks include a first memory block constituted by an array of dual port memory cells and a pair of second memory blocks each constituted by an array of single port memory cells and two sets of word lines are arranged for the two groups of memory cells of the first memory block.

9. A semiconductor integrated circuit according to claim 1, wherein said address signals are entered by way of an MPU bus and a system bus and said plurality of memory blocks include a first memory block capable of being accessed by way of both the MPU bus and the system bus within a memory access cycle on a time division basis and a second memory block capable of being accessed only by way of said MPU bus.

10. A semiconductor integrated circuit comprising:
    a plurality of memory blocks each provided with a set of word lines shared by the other memory blocks;
    one or more than one address decoders connected to a end of said set of word lines for decoding address signals;
    an address switch circuit for choosing an address signal out of a plurality of entered address signals and giving it to an appropriate one of said address decoders;
    a latch circuit inserted into said set of word lines connecting said plurality of memory blocks for latching address signals by way of said set of word lines;
    a logic circuit for logically processing a value read out of the memory block upstream to said latch circuit and controlling the operation of reading/writing data from and into the memory block downstream to said latch circuit; and
    a control circuit for generating a first control signal for said address switch circuit, a second control signal for said latch circuit with a given first delayed timing in synchronism with said first control signal and a third control signal for said logic circuit with a given second delayed timing in synchronism with said first control signal on a time division basis in order to control said memory blocks such that they may be accessed by different respective address signals.

11. A semiconductor integrated circuit according to claim 10, wherein said given first delayed timing is determined by a time required for operations of said address decoders, and said given second delayed timing is determined by a time required for both operations of said address decoders and reading operations of said plurality of memory blocks.

12. A semiconductor integrated circuit according to claim 10, wherein said address decoders are row decoders commonly arranged for said plurality of memory blocks.

13. A semiconductor integrated circuit according to claim 10, wherein said address decoders are row decoders commonly arranged for said plurality of memory blocks and column decoders for selecting columns of said plurality of memory blocks.

14. A semiconductor integrated circuit according to claim 10, wherein it further comprises a plurality of address buffer circuits arranged accommodate address signals entered by a plurality of interfaces.

15. A semiconductor integrated circuit according to claim 10, wherein each of said memory blocks is constituted by an array of single port memory cells.

16. A semiconductor integrated circuit according to claim 10, wherein said plurality of memory blocks include a first memory block constituted by an array of dual port memory cells and a pair of second memory blocks each constituted by an array of single port memory cells and two sets of word lines are arranged for the two groups of memory cells of the first memory block.

17. A semiconductor integrated circuit according to claim 10, wherein said address signals are entered by way of an MPU bus and a system bus and said plurality of memory blocks include a first memory block capable of being accessed by way of both the MPU bus and the system bus within a memory access cycle on a time division basis and a second memory block capable of being accessed only by way of said MPU bus.

18. A semiconductor integrated circuit comprising:
    first and second memory blocks each provided with a set of word lines shared by said memory blocks, said first memory block being a memory block for storing tag address and valid data for a cache memory, said second memory block being a memory block for storing cache data for the cache memory;

one or more than one address decoders connected to an end of said set of word lines for decoding address signals;

an address switch circuit for choosing an address signal out of a plurality of entered address signals and giving it to an appropriate one of said address decoders;

a latch circuit inserted into said set of word lines connecting said plurality of memory blocks for latching address signals by way of said set of word lines;

a comparator/hit generating circuit for generating a hit signal on the basis of a value read out of said first memory block; and a control circuit for generating a control signal for controlling said latch circuit and a control signal for controlling said comparator/hit generating circuit on a time division basis to control them such that said first memory block is accessed by means of a pair of address signals in a memory access cycle on a time division basis while said second memory block is accessed by using either of a pair of address signals.

19. A semiconductor integrated circuit according to claim 18, wherein said address decoders are row decoders commonly arranged for said plurality of memory blocks.

20. A semiconductor integrated circuit according to claim 18, wherein said address decoders are row decoders commonly arranged for said plurality of memory blocks and column decoders for selecting columns of said plurality of memory blocks.

21. A semiconductor integrated circuit according to claim 18, wherein it further comprises a plurality of address buffer circuits arranged accommodate address signals entered by a plurality of interfaces.

22. A semiconductor integrated circuit according to claim 18, wherein said control circuit generates on a time division basis a control signal for controlling said address switch circuit and with a delayed timing a control signal synchronized with said control signal for controlling said latch circuit in order to control said memory blocks such that they may be accessed by different respective address signals.

23. A semiconductor integrated circuit according to claim 18, wherein said delayed timing is determined by a time required for operations of said address decoders.

24. A semiconductor integrated circuit according to claim 18, wherein each of said memory blocks is constituted by an array of single port memory cells.

* * * * *

UNITED STATES PATENT AND TRADEMARK OFFICE
CERTIFICATE OF CORRECTION

PATENT NO. : 5,241,510
DATED : August 31, 1993
INVENTOR(S) : Tsuguo Kobayashi et al.

It is certified that error appears in the above-indentified patent and that said Letters Patent is hereby corrected as shown below:

Claim 4, column 11, line 35, insert --to-- after "arranged".

Claim 10, column 12, line 2, change "a end" to --an end--.

Claim 14, column 12, line 45, insert --to-- after "arranged".

Signed and Sealed this

Ninth Day of August, 1994

Attest:

BRUCE LEHMAN

Attesting Officer

Commissioner of Patents and Trademarks